(12) United States Patent
Sdrulla et al.

(10) Patent No.: US 8,436,367 B1
(45) Date of Patent: May 7, 2013

(54) SIC POWER VERTICAL DMOS WITH INCREASED SAFE OPERATING AREA

(75) Inventors: Dumitru Sdrulla, Bend, OR (US); Bruce Odekirk, Bend, OR (US); Marc Vandenberg, Bend, OR (US)

(73) Assignee: Microsemi Corporation, Bend, OR (US)

( * ) Notice: Subject to any disclaimer, the term of this patent is extended or adjusted under 35 U.S.C. 154(b) by 56 days.

(21) Appl. No.: 13/231,877

(22) Filed: Sep. 13, 2011

Related U.S. Application Data

(63) Continuation-in-part of application No. 13/195,632, filed on Aug. 1, 2011.

(60) Provisional application No. 61/382,087, filed on Sep. 13, 2010, provisional application No. 61/369,765, filed on Aug. 2, 2010.

(51) Int. Cl.
*H01L 31/0312* (2006.01)

(52) U.S. Cl.
USPC ............ 257/77; 257/328; 257/329; 257/341; 257/E29.997

(58) Field of Classification Search .................. 257/328, 257/E29.297
See application file for complete search history.

(56) References Cited

U.S. PATENT DOCUMENTS

| | | | |
|---|---|---|---|
| 5,506,421 A | 4/1996 | Palmour | |
| 5,963,807 A | 10/1999 | Ueno | |
| 6,201,280 B1 | 3/2001 | Bakowski et al. | |
| 6,503,786 B2 | 1/2003 | Klodzinski | |
| 6,653,659 B2 | 11/2003 | Ryu et al. | |
| 6,664,594 B2 | 12/2003 | Klodzinski | |
| 7,217,954 B2 | 5/2007 | Kusumoto et al. | |
| 7,221,010 B2 | 5/2007 | Ryu | |
| 7,381,992 B2 | 6/2008 | Ryu | |
| 7,691,711 B2 | 4/2010 | Stum et al. | |
| 2003/0107041 A1 | 6/2003 | Tanimoto et al. | |
| 2004/0036113 A1 | 2/2004 | Ueno | |

OTHER PUBLICATIONS

Palmour, et al., John W., "Silicon Carbide Switching Devices: Pros and Cons for Mosfets, JFETs and BJTs," Proceedings PCIM Europe Conference, 2009, pp. 311-316.

Matocha, et. al., Kevin, "1400 Volt, 5 mΩ-cm2 SiC MOSFETs for High Speed Switching," Proceedings of the 22nd International Symposium on Power Semiconductor Devices & ICs, Hiroshima, Japan, pp. 365-368, 2010.

(Continued)

*Primary Examiner* — Thien F Tran
(74) *Attorney, Agent, or Firm* — Marger Johnson & McCollom, P.C.

(57) ABSTRACT

A SiC Power Semiconductor device of the Field Effect Type (MOSFET, IGBT or the like) with "muted" channel conduction, negative temperature coefficient of channel mobility, in situ "ballasted" source resistors and optimized thermal management of the cells for increased Safe Operating Area is described. Controlling the location of the Zero Temperature Crossover Point (ZTCP) in relationship to the drain current is achieved by the partition between the "active" and "inactive" channels and by adjusting the mobility of the carriers in the channel for the temperature range of interest. The "Thermal management" is realized by surrounding the "active" cells/fingers with "inactive" ones and the "negative" feedback of the drain/collector current due to local increase of the gate bias is achieved by implementing in-situ "ballast" resistors inside of each source contact.

19 Claims, 21 Drawing Sheets

OTHER PUBLICATIONS

Sung, et al., Woongje, "A Novel 4H-SiC IGBT Structure with Improved Trade-off between Short Circuit Capability and On-state Voltage Drop", Proceedings of the 22nd International Symposium on Power Semiconductor Devices & ICs, Hiroshima, Japan, pp. 217-220, 2010.

Matocha, et. al., Kevin, Time-Dependent Dielectric Breakdown of 4H-SiC MOS Capacitors and DMOSFETs, IEEE Trans. on Elec. Dev. vol. 55, No. 8, Aug. 2008, pp. 1830-1834.

Sugawara, et al., Y., "4.5 kV Novel High Voltage High Performance SiC-FET "SIAFET"", IEEE Catalog No. 00CH37094C, ISPSD 2000, 4 pages.

Peters, et al., Dethard, An 1800 V Triple Implanted Vertical 6H-SiC MOSFET, IEEE Trans. On Elec. Dev., vol. 46, No. 3, Mar. 1999, pp. 542-545.

Losee, et al., Pete A., "DC and Transient Performance of 4H-SiC Double-Implant MOSFETs ," IEEE Trans on Elec. Dev., vol. 55, No. 8, Aug. 2008, pp. 1824-1829.

Takayama, et al., D., Static and Dynamic Characteristics of 4-6 kV 4H-SiC SIAFETs, ISPSD. Osaka, Japan, 2001, pp. 41-44.

Miura, et al., Naruhisa, Successful Development of 1.2 kV 4H-SiC MOSFETs with the Very Low On-Resistance of 5mΩ-cm2 , ISPSD Jun. 4-8, 2006, Naples, Italy, 4 pages.

Ruff, et al., Martin, "SiC Devices: Physics and Numerical Simulation", IEEE Trans. On Elec. Dev. vol. 41, No. 6, Jun. 1994, pp. 1040-1054.

Ryu, et al., Sei-Hyung, "10kV, 5A, 4H-SiC Power DMOSFET" ISPSD Jun. 4-8, 2006, Naples, Italy, 4 pages.

Cooper, et al., James A., "Status and Prospects for SiC Power MOSFETs," IEEE Trans. On Elec. Dev. vol. 49, No. 4., Apr. 2002, pp. 658-664.

Potbhare, et al., Siddharth, "A Physical Model of High Temperature 4H-SiC MOSFETs", IEEE Trans. On Elec. Dev., vol. 55, No. 8, Aug. 2008, pp. 2029-2040.

Lu, et al., Chao-Yang, "Effect of Process Variations and Ambient Temperature on Electron Mobility at the SiO2/4H-SiC Interface", IEEE Trans., On Elec. Dev., vol. 50, No. 7, Jul. 2003, pp., 1582-1588.

Ueda, et al., Daisuke, "A New Vertical Double Diffused MOSFET—The Self-Aligned Terraced-Gate MOSFET," IEEE Transactions on Electron Devices, vol. ED-31, No. 4, Apr. 1984, pp. 416-420.

Cree, Inc., Z-FET CMF20120D Industry's First SiC MOSFET sales flyer, 2011, Durham, North Carolina, 2 pages, www.cree.com.

Cree, Inc., CMF20120D-Silicon Carbide Power MOSFET 1200 v 80 MΩ, Z-FET MOSFET N-Channel Enhancement Mode data sheet, 2010-2011, Durham, North Carolina, pp. 1-13, www.cree.com/power.

Spirito, P., et al. "Analytical Model for Thermal Instability of Low Voltage Power MOS and S.O.A. in Pulse Operation," Proceedings International Symposium on Power Semiconductor Devices and IC's, 2002, pp. 269-272.

Ryu, Sei-Hyung, et al., 4H-SIC DMOSFETS for High Frequency Power Switching Applications, Mat. Res. Soc. Symp. Proc. vol. 764, 2003 Materials Research Society.

μex1(T) : Channel mobility with positive temp. coeff. of a SiC Mosfet
μn(T) : Channel mobility of a Si Power Mosfet (negative temperature coefficient)

US 8,436,367 B1

SIC POWER VERTICAL DMOS WITH INCREASED SAFE OPERATING AREA

CROSS REFERENCE TO RELATED APPLICATIONS

This application claims the benefit of U.S. provisional patent application Ser. No. 61/382,087, filed Sep. 13, 2010, and is a continuation-in-part of copending U.S. application Ser. No. 13/195,632, filed Aug. 1, 2011, titled "Low Loss SiC MOSFET," which claims the benefit of U.S. provisional patent application 61/369,765, filed Aug. 2, 2010, all herein incorporated by reference.

FIELD OF THE INVENTION

This invention pertains to Power MOSFET Semiconductor Devices to be used under such electrical conditions that the entire Safe Operating Area (hereinafter "SOA") defined by the maximum allowed current and the maximum blocking voltage has to be available when the device is in the ON state, and more particularly to improving the SOA characteristics of silicon-carbide (SiC) vertical power MOSFET devices.

BACKGROUND OF THE INVENTION

Commonly-owned U.S. Pat. Nos. 6,503,786 and 6,664,594 to Klodzinski, incorporated herein by this reference, describe improvements in the manufacture and structure of silicon vertical power MOSFET devices to achieve increased SOA and to enhance linear operation of such devices. It is desirable to extend these capabilities to SiC vertical power MOSFET devices. However, the methods and structures employed in silicon power MOSFET technology do not readily extend to making SiC power MOSFET devices.

As shown in FIG. 1 (the ideal SOA of a Power MOSFET), the safe operating area of a Power MOSFET is limited by the blocking voltage on the right side, by the Rdson on the left side, by the maximum current rating and by the maximum power dissipation capability (the slanted lines on the upper right side of the SOA graph) of the device.

Recently, referring to FIG. 2, Spirito at al (FIG. 6 from Spirito, "Analytical model for thermal instability of low voltage power MOS and S.O.A. in pulse operation," Proceedings ISPSD 2002, pp. 269-272) have shown that the SOA of silicon Power MOSFETs is in fact restricted on the high voltage high current side by the thermal instability of the device, with thermal instability triggered by the negative temperature coefficient of the Vth, if the device is operated at a drain current level below the Zero Temperature Coefficient Point.

A real SOA graph is shown in FIG. 3 (Actual SOA curves of a switching Power MOSFET) where it can be seen that both the bias conditions and the die temperature play a role in the thermal instability of the device.

As it is well known to the person familiar with the field, the On Resistance of the Power MOSFETs is lower if the density of the "cells" (the structure consisting of source, gates and source contacts) is higher.

As each cell is turned on, the slightest non-uniformity of the turn-on voltage from cell to cell will make one or several cells "steal" most if not all the drain current. This non-uniformity is normal in even state-of-the-art fabrication processing. Due to the negative temperature coefficient of the threshold voltage, the cells with increased current will have an even lower Vth and will start conducting even more current. The end result of such a local self heating phenomenon is the shorting of those cells. This effect, inherent to any MOSFET device, is very similar to the shorting of the base-emitter junction of a Power BJT due to the negative temperature coefficient of the Emitter Base diode.

In the case of a SiC MOSFET, for which a better thermal conductivity than silicon would seem to alleviate one aspect of this problem (the thermal one), the die size and the high packing density of the cell design aggravates the conditions that would initiate thermal instability under high bias conditions.

In addition, for a SiC Power MOSFET with a voltage rating of 1700V or lower, the channel resistance is the dominant component of the total ON resistance. Therefore, while in the saturation region, the temperature dependence of the channel resistance of a SiC MOSFET is of the utmost importance.

For applications where the Power Mosfet "operates" in the "saturation region" of the output characteristics an increased SOA of the device is significantly more important than its On Resistance and therefore trade offs to improve SOA at the expense of a higher Rdson are perfectly acceptable.

Power SiC transistors are commonly operated at high voltages and high drain currents, leading to considerable self heating, and in this way the operating temperature can be significantly higher.

Examples of applications where the "linear" operation of a Power Mosfet is needed are:
  Battery charger (Cell phone, portable equipment, electrical vehicles)
  Fan controller (automotive)
  Power over Ethernet (TCP/IP routers, network switches)
  Linear Power Amplifiers (audio)
  Load switch, and virtually ALL applications where the device is switched ON-OFF and the "load" line travels through the high voltage-high current regimes of operation.

In addition, a high frequency of operation will further degrade SOA, therefore all provisions from the U.S. application Ser. No. 13/195,632 are applicable to this patent.

SUMMARY OF THE INVENTION

It is an object of this invention to disclose methods and device structures suitable for a SiC Power MOSFET with increased SOA.

The foregoing and other objects, features and advantages of the invention will become more readily apparent from the following detailed description of a preferred embodiment of the invention which proceeds with reference to the accompanying drawings.

DETAILED DESCRIPTION

Figure 1:
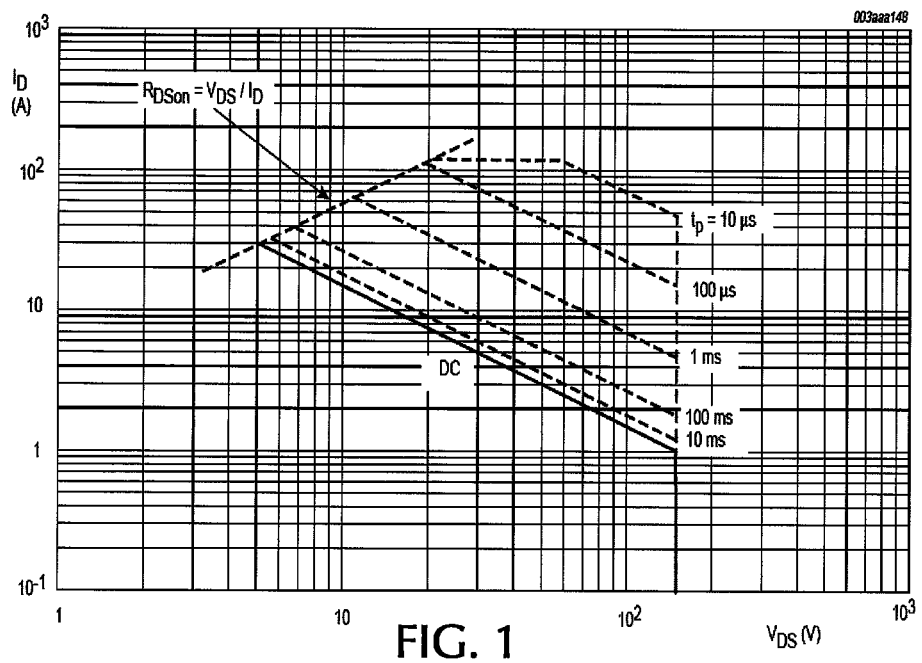
FIG. 1 is a drain-current vs. drain-source voltage graph of a typical (idealized) data sheet SOA of a Silicon Power MOSFET.

In the drawings, which are not necessarily to scale, like or corresponding elements of the SiC MOSFETs are denoted by the same referenced numerals.

Figure 2:
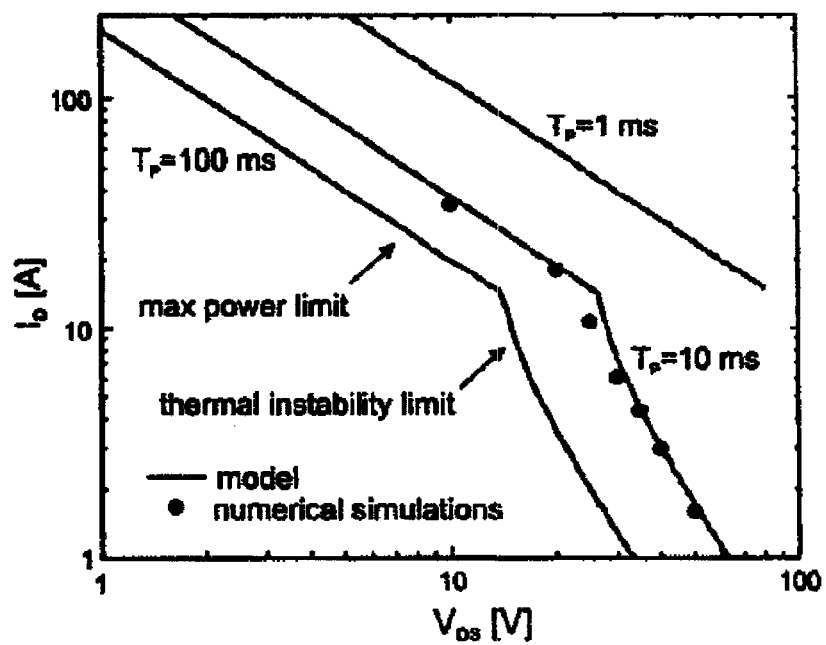
FIG. 2 is a graph like FIG. 1 showing the SOA of a "real" Silicon Power MOSFET as published by Spirito at al.
Figure 3:
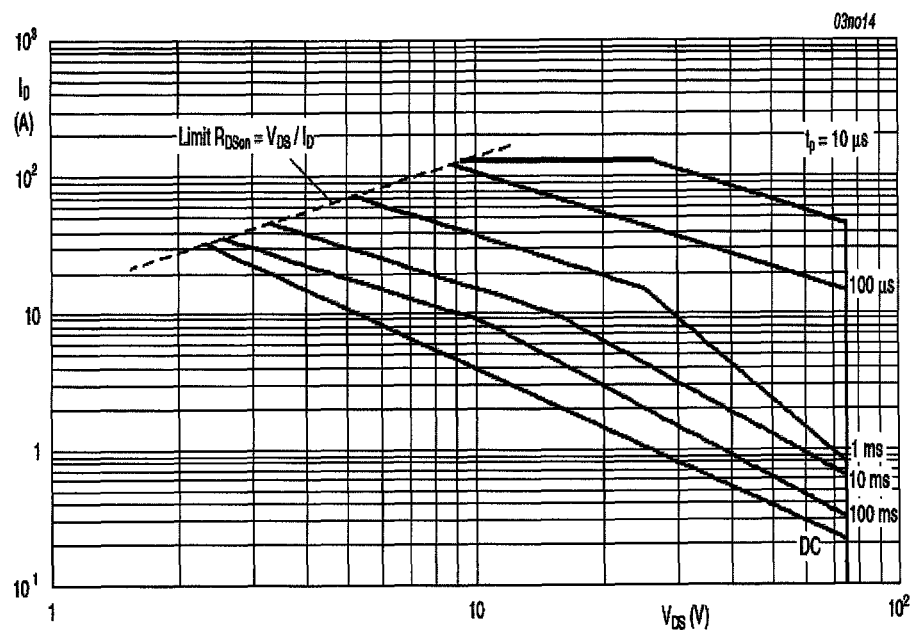
FIG. 3 is a graph of actual SOA curves of a Silicon Power MOSFET.

FIG. 1 represents an ideal SOA of a Power MOSFET made on Silicon or SiC. In reality, the power dissipation capability of the device is restricted at increased drain biases, as very well described in FIG. 2 and FIG. 3. An object of this invention is to "restore" the SOA of the Power MOSFET to its full capability across the entire voltage range.

The following will be clear for people skilled in the art and as explained in many publications on this topic of SOA of a Power MOSFET (for example see "Power Semiconductor Devices, Theory and Applications, Benda, Gowar, and Grant, John Wiley & Sons 1999). There are two mechanisms contributing to the destruction of the device while stressed under increased current and voltage conditions:

the negative temperature coefficient of the drain/collector current in relationship to the gate-source bias;

the non-uniform temperature distribution across the die due to microscopic imperfections of the die attach process.

Figure 12A:
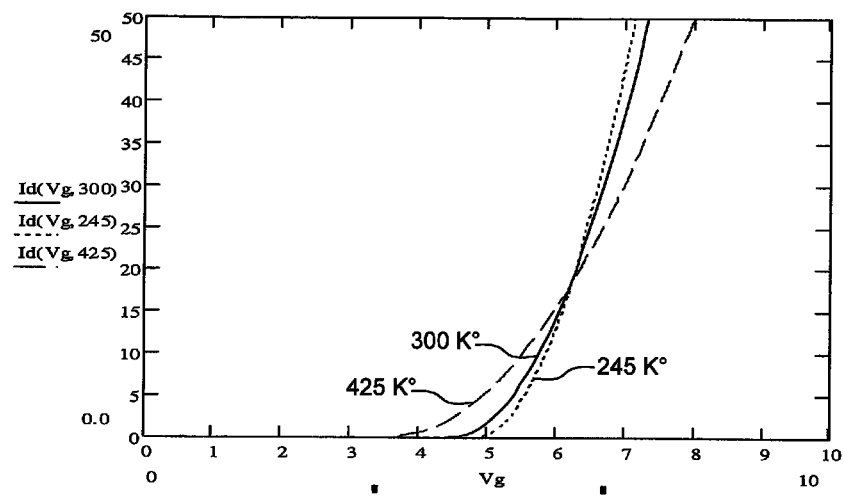
FIGS. 12A and 12B are two Id-Vgs plots comparing two vertical SiC Power MOSFETS operated at three Kelvin temperatures (300K-solid line, 245K-dashed line, 425K-broken line), and having different crossover (ZTCP) points.
Figure 12B:
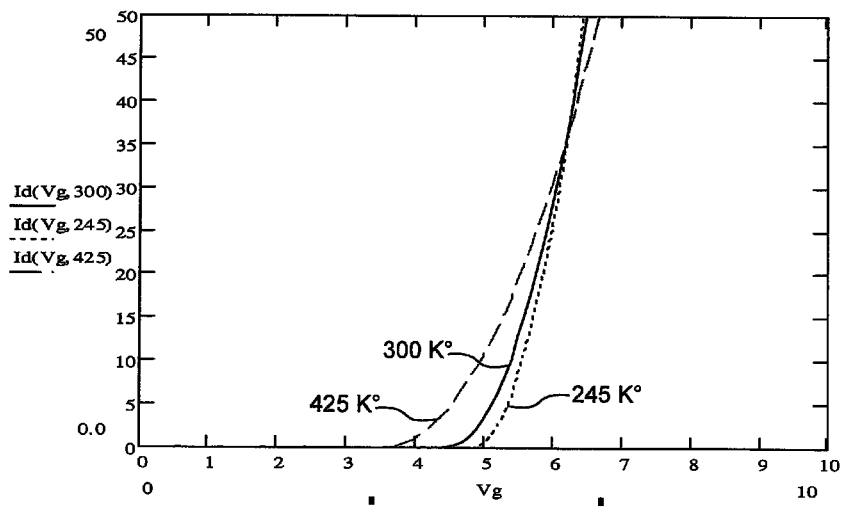
Figure 13:
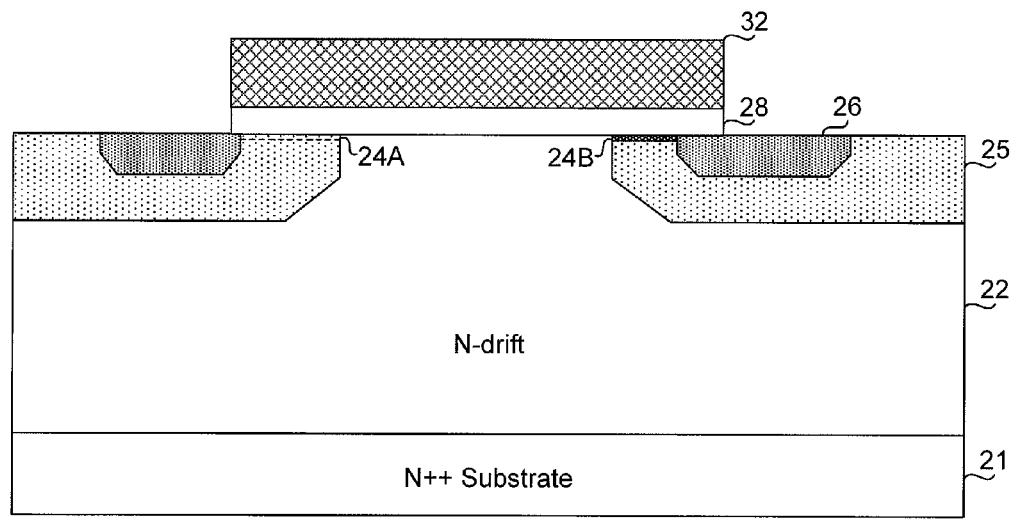
FIG. 13 is a cross-sectional view of a vertical SiC Power MOSFET, according to another embodiment of the invention, with uniform gate oxide and "muted" channel by offsetting the source implant in specific areas on the die.
Figure 14:
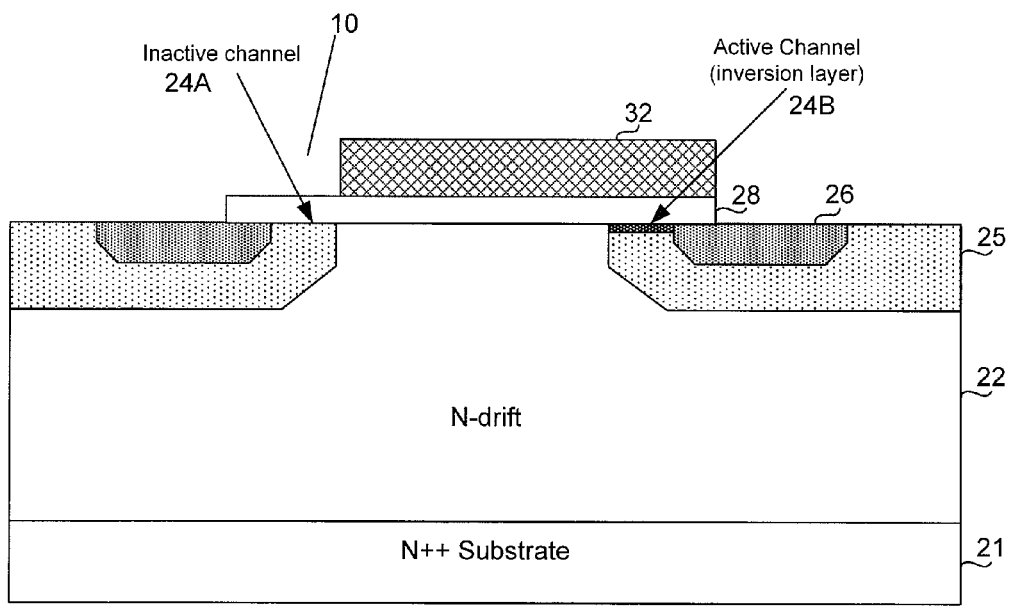
FIG. 14 is a cross-sectional view of a vertical SiC Power MOSFET with uniform gate oxide and "notched" poly gate at specific locations, according to another embodiment of the invention.
Figure 15:
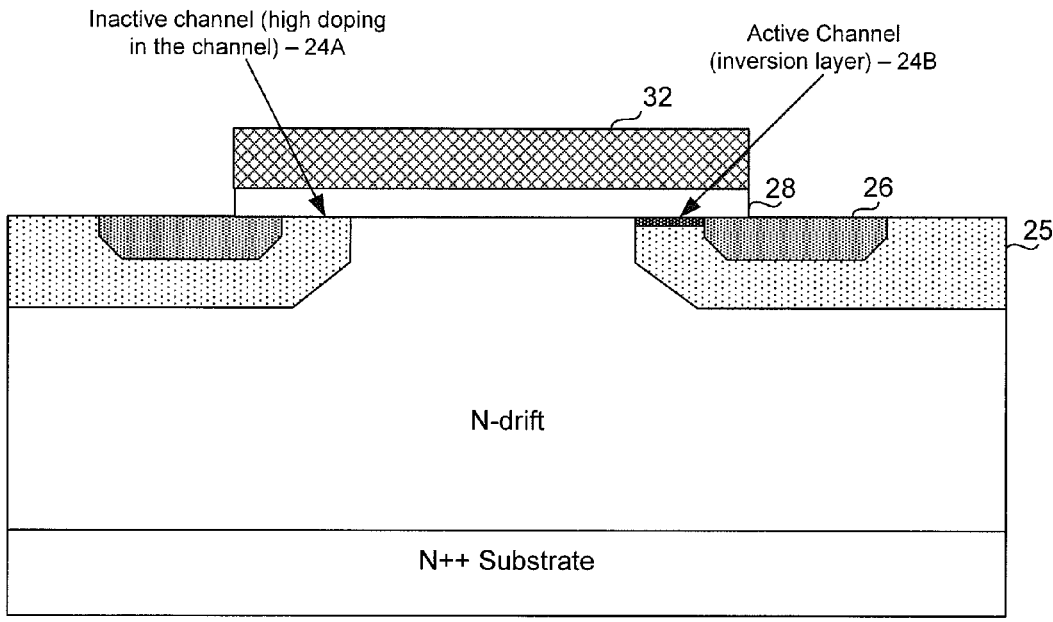
FIG. 15 is a cross-sectional view of a vertical SiC Power MOSFET with uniform gate oxide and "tailored" Vth by adjusting the doping in the channel (retrograde doping in the P-well), according to another embodiment of the invention.
Figure 16:
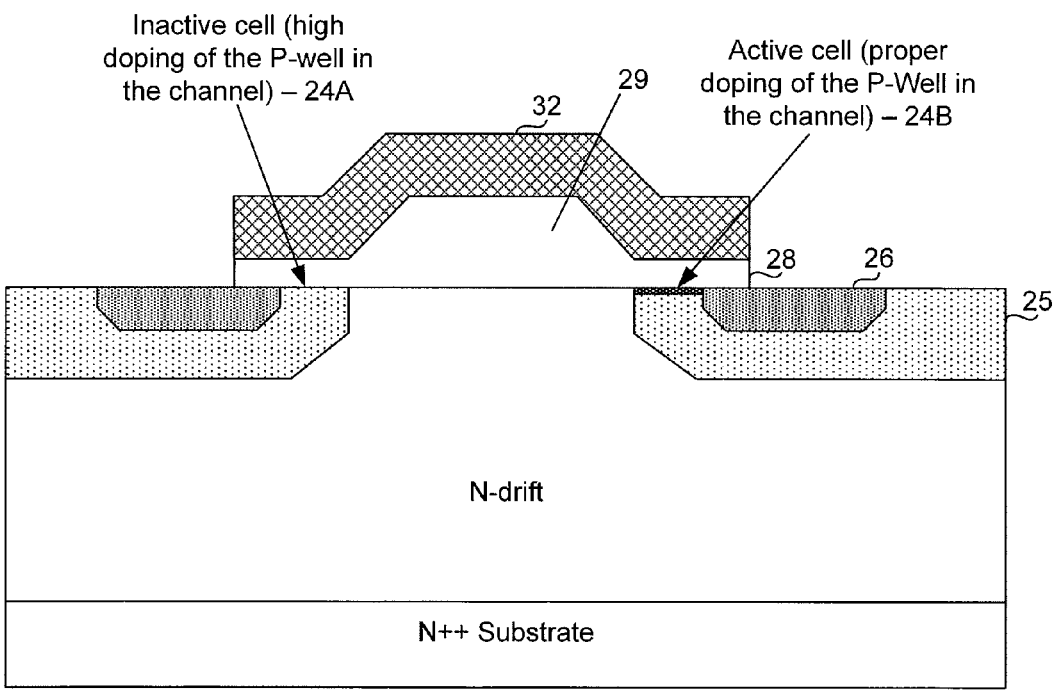
FIG. 16 is a cross-sectional view of a vertical SiC Power MOSFET with Terraced Gate oxide and inactive cells using increased doping in the channel, according to another embodiment of the invention.
Figure 17:
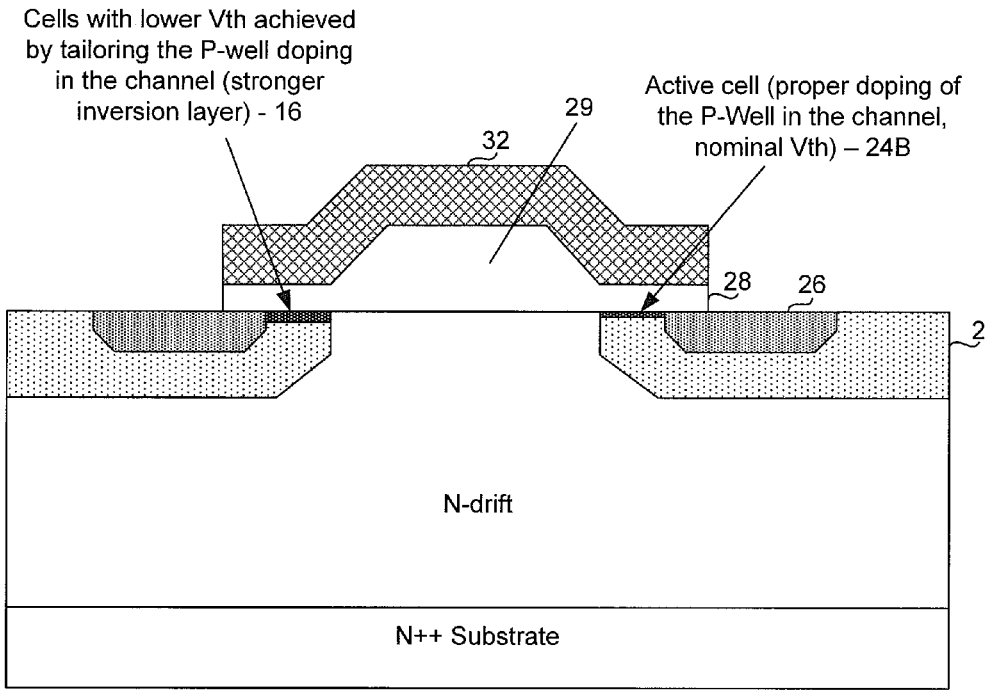
FIG. 17 is a cross-sectional view of a vertical SiC Power MOSFET with Terraced Oxide and lower Vth at specific locations, using lower doping of the channel (retrograde doping profile of the P-Well), according to another embodiment of the invention.
Figure 18:
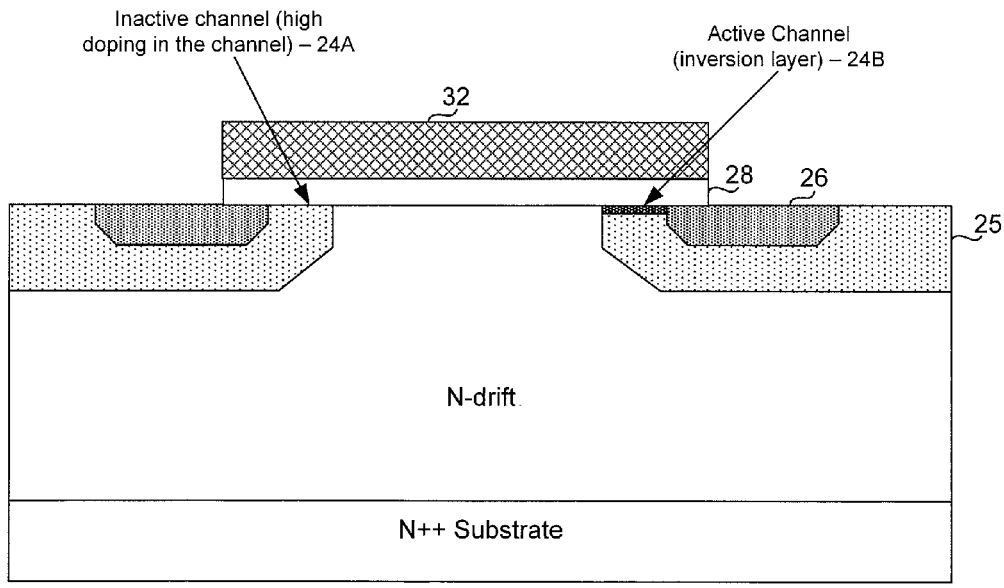
FIG. 18 is a cross-sectional view of a vertical SiC Power MOSFET with uniform gate oxide and "tailored" Vth by adjusting the doping (lower) of the channel (P-Well with retrograde doping), according to another embodiment of the invention.

If a Power MOSFET has only positive temperature coefficient of the drain current vs. the gate bias across the entire range of the drain currents (see FIGS. 12A and 12B above the crossover or ZTCP of the different temperature curves) then for any temperature increment the drain current will decrease, effectively "cooling off" the respective cell which momentarily had a higher temperature due to minute process variations.

Klodzinski, in commonly-owned U.S. Pat. No. 6,664,594B1, very clearly defines the elements which govern the dependence of the drain current on the gate bias, and the equation from his patent is presented here:

$$Idr(Vg,T) := \mu n(T) \cdot Cox \cdot z/2 \cdot L \cdot (Vg-Vth(T))^2$$

where $\mu n(T)$ is the mobility in the channel, Cox is the capacitance of the gate oxide, Z is the channel width, L is the channel length, Vg is the applied voltage on the gate terminal and Vth(T) is the temperature dependent threshold voltage.

Klodzinski also shows that, due to the negative temperature dependence of the Vth(T) and $\mu n(T)$ the traces of the drain current vs. gate-source voltage for various temperatures have a cross over point where, for a given Vgs, the drain current is independent of the temperature (Zero Temperature Coefficient Point). When the device is operated above ZTCP, the current will decrease if the temperature increases and the other way around if the device is operated at currents below the ZTCP.

This mechanism of the instability of the drain current with temperature is valid for individual "cells" inside of die (and here the term of "cell" refers to any element of the die which is repeated across the active area of the die) or for SiC Mosfet dies connected in parallel. In other words, if SiC Power Mosfet chips are connected in parallel in a hybrid circuit or a power module, and the hybrid or the module is biased such that the total current of the part is below the ZTCP, then the die with the largest Vth drop at higher temperatures will "hog" all the current and eventually will get destroyed.

It is therefore desirable to create (by design and by process) a SiC Power Mosfet with a ZTCP as low as possible, even if by doing so the ON resistance becomes higher.

What is not obvious and has never been fully disclosed is if the channel mobility is independent of the temperature, or if it has a positive temperature coefficient, the Id-Vgs traces for different temperatures will never cross in the range of drain current of interest, even if the threshold voltage of the Mosfet has a negative temperature coefficient.

Figure 4:
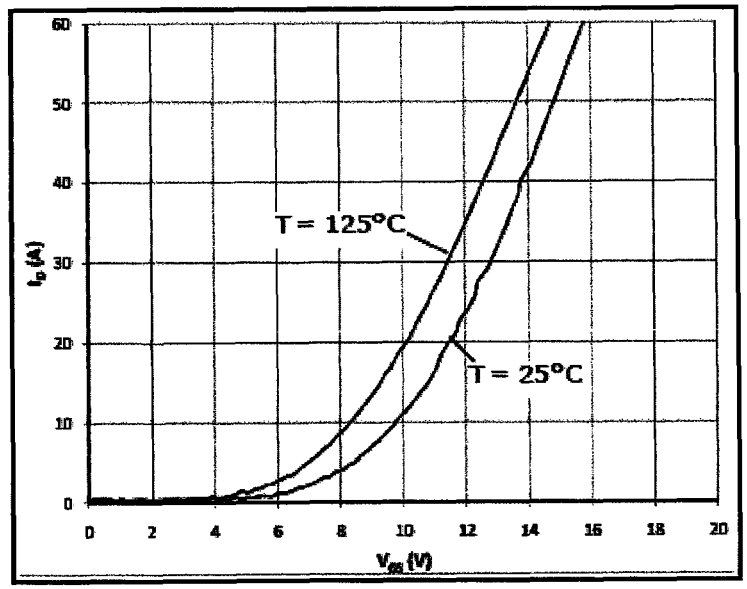
FIG. 4 is a typical transfer characteristic of a state of the art SiC Power MOSFET from the 1200V CMF20120D Cree data sheet, page 8, FIG. 3 © 2010-2011, showing two traces for different temperatures which do not cross.

The graphs in the FIG. 4 illustrate just that, where the Id-Vgs traces at two different temperatures do not cross, apparently due to a slightly positive temperature coefficient of the mobility of the inversion layer (Idex).

FIG. 4, taken from the data sheet of a SiC Power Mosfet recently launched on the market shows the transconductance graphs for two temperatures, 25 C and 125 C. As one can easily note, across the entire drain current range, the drain current will increase (for the same gate source voltage) when there is a temperature increase. This SiC Mosfet will be thermally unstable, especially at increased dissipated powers and its SOA will be greatly reduced, specially at increased drain source voltages. More so, this SiC Power Mosfet will not be suitable for paralleling as any non uniformity of the die attach process will induce a thermal runaway of the die with a higher thermal resistance.

Figure 23:
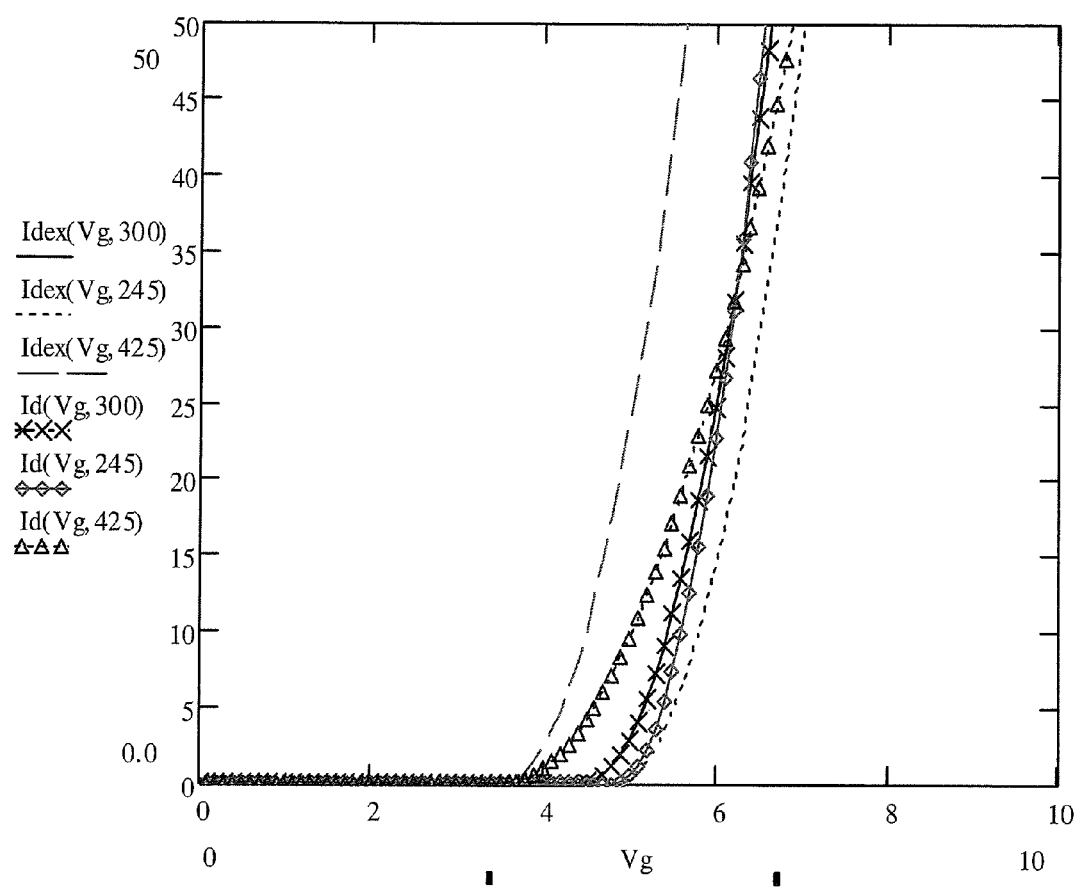
FIG. 23 is a graph of the transfer characteristics for two SiC vertical MOSFET device modeled by the inventors—three traces like those of FIGS. 20B and 21B superimposed—showing that for the first device the traces do not cross and for the second device that the traces have a crossover point. (Note: the room-temperature traces shown in solid lines for the two devices coincide.)
Figure 24:
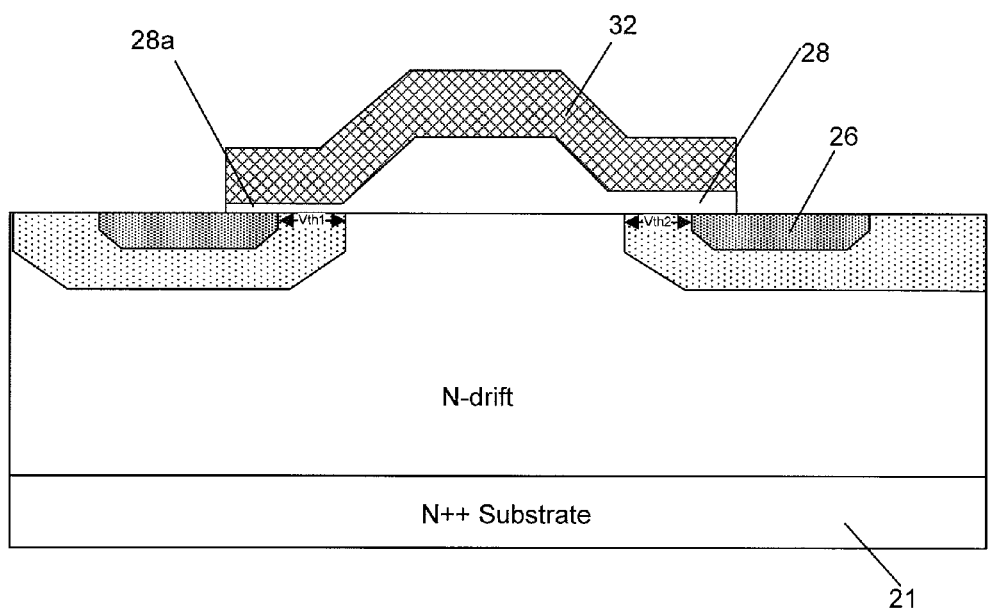
FIG. 24 is a cross-sectional view of a SiC Power MOSFET with terraced oxide, having the same channel length and two thicknesses of gate oxides, according to another embodiment of the invention.

FIG. 23 shows superimposed transfer characteristics, three traces each, for two inventor-modeled SiC vertical MOSFET devices: one with a slightly positive temperature coefficient—and thus no crossover point, and the other with a "normal" variation of inversion layer mobility vs. temperature—having a crossover point.

As one can clearly see in FIG. 23, the Id-Vgs traces have a ZTCP while the Idex-Vgs ones do not cross. If the operating current of the first device is close or above the crossover point this Power Mosfet will be thermally stable while for the second type of Mosfet the device will thermally run away under all drain current conditions, providing that the temperature of the die is sufficiently high.

This dependence of the drain current on the gate-source voltage and temperature is true regardless of the negative temperature coefficient of the threshold voltage. In other words, the only reason a power Mosfet has a Zero Temperature Coefficient Point is due to the negative temperature coefficient of the channel mobility and this is the necessary condition for a Power Mosfet to stand the chance of being thermally stable and exhibit a reasonable large SOA. As explained in Klodzinski patent the lower the ZTCP is the larger the SOA of the Power Mosfet will become.

One aspect of the thermal instability of the Power Mosfets is the capability of the part to dissipate power. For short power pulses the SOA is limited only by the voltage and the current capability of the part, while for longer power pulses the SOA is significantly limited as Spirito et al have shown.

It is an object of this patent to describe means and methods to create a more uniform temperature distribution across the active area of the die by managing the placement of the active and inactive cells across the die.

Historically the mobility in the inversion layer of a SiC Mosfet has always been low and in the quest to increase its value the designers and process engineers have entirely overlooked the fundamental requirement of a SiC Power Mosfet to have a negative temperature dependence of the channel mobility.

For example, in the paper "Effect of temperature variation (300-600K) in MOSFET modeling in 6H-silicon carbide", Md. Hasanuzzaman, et al. Solid State Electronics, 48, 2004, pp 125-132, paragraph 2.3 Mobility, it is clearly stated that: "Initially, the mobility increases (which is opposite to the expected nature of mobility) for a working temperature range of 300-500K . . . . Therefore, the inversion layer mobility is almost constant over the temperature range (300-500K)". Based on the above theoretical analysis and in the context of cited references it is clear that in the case of SiC Mosfet the final device might exhibit the undesirable feature of a constant or even slightly positive temperature coefficient of the inversion layer mobility, in which case the part is unsuited for paralleling and will have a limited SOA.

SiC Vertical Power MOSFET Structure

Figure 20A:
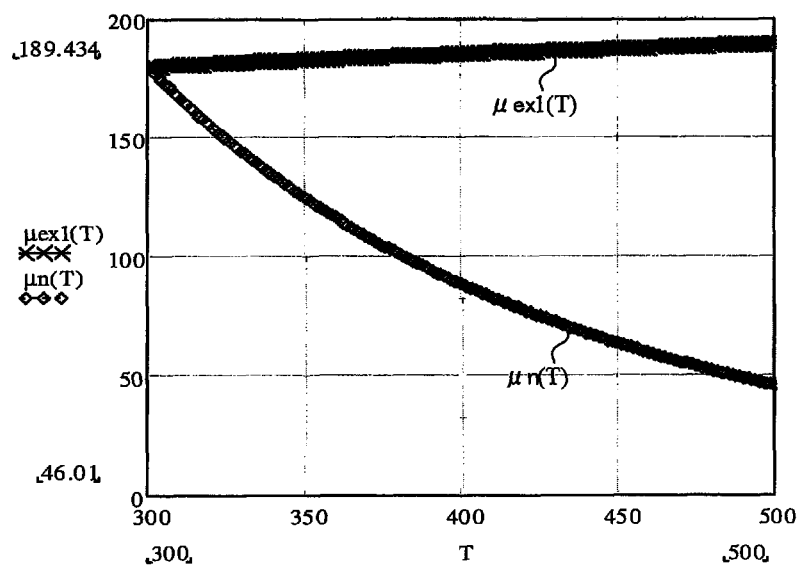
FIG. 20A is a plot of channel mobility vs. temperature for a SiC MOSFET with a positive temperature coefficient.
Figure 20B:
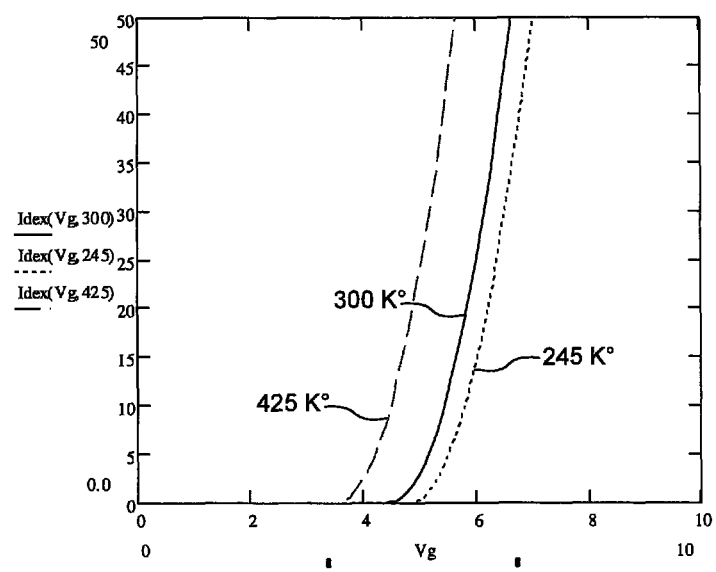
FIG. 20B is an Id-Vgs plot for a modeled SiC MOSFET as described in FIG. 20A, for a device like that of FIG. 4.
Figure 21A:
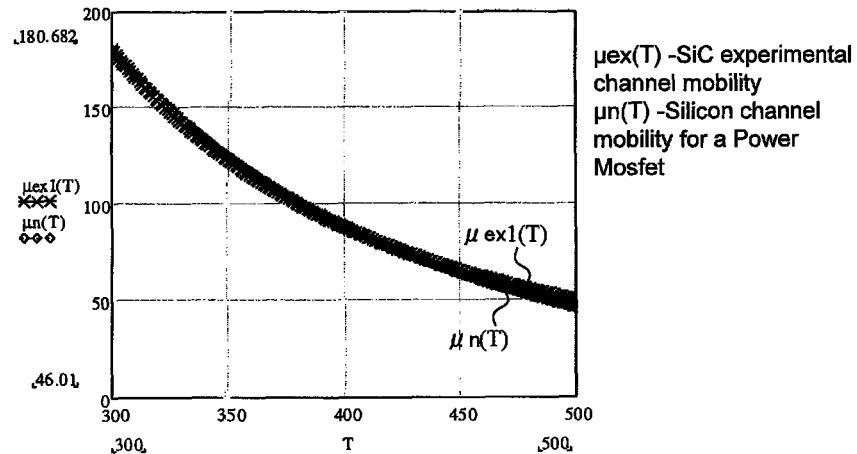
FIG. 21A is a plot of channel mobility vs. temperature for a SiC MOSFET as described.
Figure 21B:
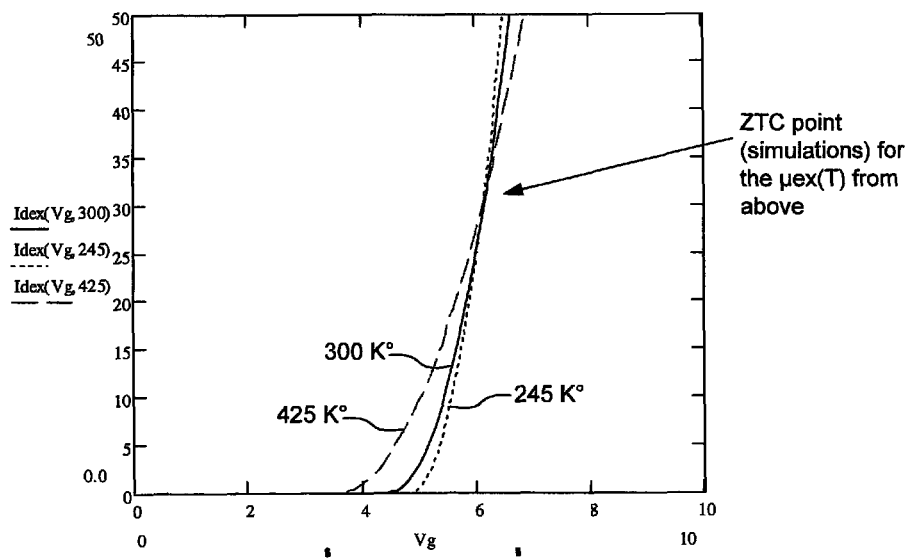
FIG. 21B is an Id-Vgs plot for a modeled SiC MOSFET as described in FIG. 21A.

Silicon carbide (SiC) vertical power MOSFET structures according to embodiments of the invention are shown in cross section in FIGS. 5A, 5B, 6A-6C, 7A-7B, 10, 11 and 13-18 and 24. Another embodiment, in which the same vertical power MOSFET structure is embodied in a SiC vertical IGBT which can have the P-type substance, epi-layer or implant, as shown in FIG. 20 of U.S. Ser. No. 13/195,632, incorporated by reference. Like reference numerals denote similar structures, and the same reference numerals are used in the description of the process for fabrication of the SiC vertical power MOSFET structure.

In various embodiments as shown in the drawings, the vertical SiC power MOSFET structure includes a mono-crystalline SiC substrate 21 of a first dopant type including an upper layer 22 of the same dopant type defining a drift region extending from an upper surface of the substrate (demarcated by its interface to the gate oxide layer 28) depthwise into the substrate. In an example of the depicted embodiments, the first dopant type of the substrate in the drift region is N-type, in which case the second, opposite dopant type, for example, the body region 25, refers to P-type. Optionally, the first dopant type of the substrate can be P-type, in which case the opposite dopant type is N-type. For simplicity, we describe the vertical power MOSFET structure in terms of an N-type substrate having P-type body regions. For simplicity, only one source region is shown in each body region, although they usually are formed in pairs as shown in U.S. Ser. No. 13/195, 632.

A JFET region 23 of the first dopant type (N-type as shown) can be formed in or on an upper portion of the upper layer, enhancing a doping concentration of the drift region around and particularly between the body regions. Alternative forms of the JFET can be used, such as in implant or epitaxial layer.

A pair of body regions 25 reside in the upper layer, within the JFET region 23, and adjoining the upper surface of the substrate. The body regions 25 are spaced apart about the portion of the drift region D1 within the JFET region. The body regions are of the second dopant type opposite the first dopant type, that is, P-type in the illustrated example. Each of the body regions has opposite lateral peripheries each forming a first PN junction with the drift region.

Using patterned oxide or photo-resist, the P-Body regions 25 are formed by ion implantation of a suitable acceptor species, preferably aluminum. To minimize residual implant damage, all implants are preferably done at elevated wafer temperatures in the temperature range 400° C.-1000° C. Retrograde doping of the P-Body regions is, in fact, preferable for ruggedness. Ion implantation naturally forms such a profile, with lighter doping of the P-Body regions at the surface of the wafers and higher (heavier) doping deeper into the SiC wafer.

Pairs of source regions 26 are spaced apart in each body region 25 across the upper surface of the substrate to define a source and body contact region at the surface. The source regions 26 in adjacent body regions are positioned laterally with respect to the lateral peripheries of the respective body regions adjoining drift region D1 to form a second PN junction spaced laterally from the first PN junction. This spacing serves to define channel regions 24A, 24B along the upper surface between each of the first and second PN junctions.

A UIS (Unclamped Inductive Switching) region (shown in U.S. Ser. No. 13/195,632) of the second dopant type can be positioned depthwise in the body region in the upper layer beneath the source regions and centered between them inward from the channel regions, to enhance a doping concentration of the body regions beneath and between the source regions without affecting gate threshold voltage.

Figure 11:
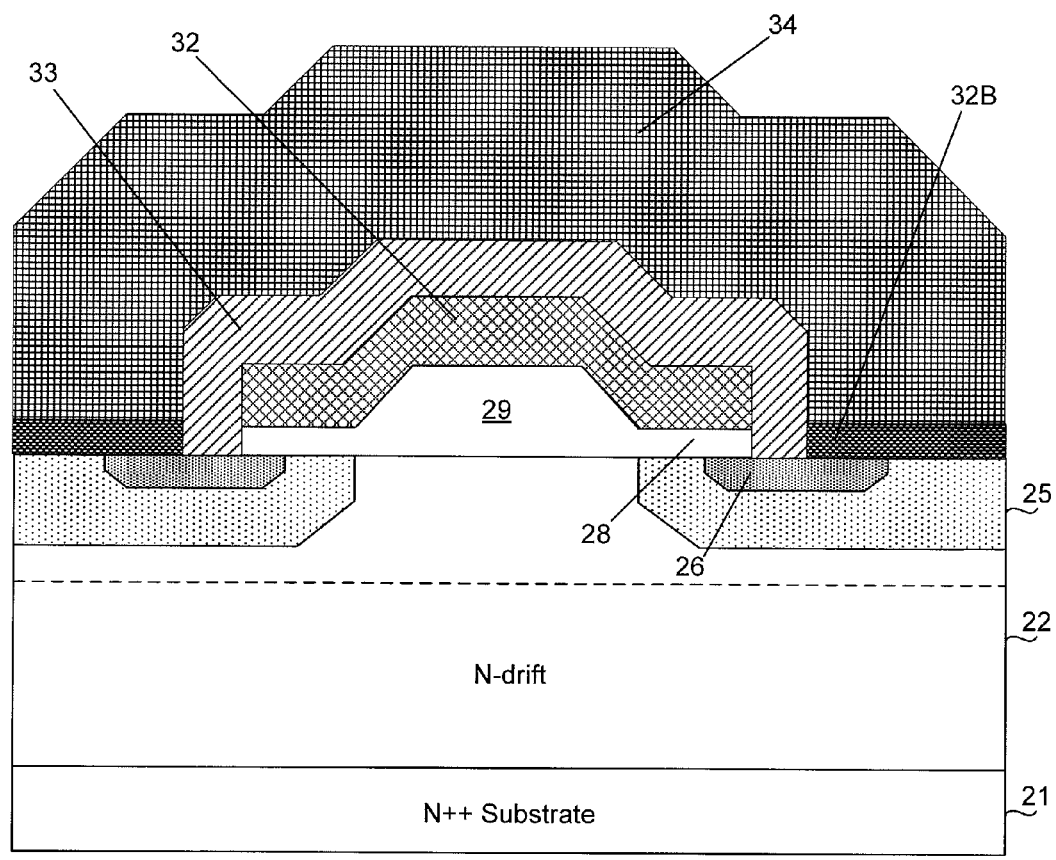
FIG. 11 is a cross-sectional view of a vertical SiC Power MOSFET with terraced oxide and in-situ "ballast" source resistors formed using "resistive" barrier metals in each cell, according to another embodiment of the invention.

A gate oxide layer 28 or 28a (FIG. 24) of a various thickness on the upper surface of the substrate extends over each of the channel regions. A gate conductor 32 typically of doped polysilicon, contacts the gate oxide layer and is coupled either to an electrode at the periphery of the substrate or directly to a metal electrode that extends along the polysilicon through a gate via in the interlayer dielectric layer 33 (FIG. 11). A source conductor 34 (FIG. 11) contacts the source regions and the body region therebetween at the upper surface of the substrate.

A terraced dielectric layer 29, typically silicon oxide, extends on the upper surface between the gate oxide layer areas 28 over the drift region D1 between the body regions. Optionally, a terraced dielectric layer can also be positioned over the drift regions at the outer peripheries of the body regions adjacent the peripheries of the JFET region, that is, beneath portions of the gate contacts overlying the drift regions laterally outward of the channel regions. The terraced dielectric layer has a second thickness greater than the first thickness of the gate oxide layer. In some embodiments (FIGS. 13-15, 18), a uniform thickness dielectric layer is used.

A pair of counterdoped regions 36 can extend along the opposite lateral, lower peripheries of each of the body regions as described and shown more fully in U.S. Ser. No. 13/195,632. The counterdoped regions are spaced below the channel regions and away from the source regions and have a doping concentration less than a doping concentration of the body region at the upper surface. The depth and counter doping concentrations are controlled in the implantation procedure. Regions 36 will have a net doping like that of the body region (P-type in the example) but a locally-reduced P-type doping concentration as a result of targeted implantation of N-type ions.

SiC Vertical Power MOSFET Process

The overall process flow is described in U.S. Ser. No. 13/195,632, incorporated by reference. The process description herein focuses on the steps and resulting structures pertinent to increasing SOA in SiC Power MOSFET devices. The Power MOSFET (or IGBT) process starts with an N+ monocrystalline SiC substrate 21 prepared according to the state of the art technology. One substrate is of the 4H polytype, but other available polytypes may also be preferred as discussed below. An N− SiC drift layer 22 is grown on the substrate, and the substrate together with the drift layer form the starting material for MOSFET fabrication.

Using patterned oxide or photo-resist an N+ layer (JFET layer 23) is preferably implanted at the desired depth and with a prescribed doping by ion implantation of a suitable donor species (preferably nitrogen). Alternatively, the N+ layer can be grown epitaxially on top of the N− drift layer and be part of the starting material 24 as shown in FIGS. 6A and 7A. The doping of the JFET layer is about one order of magnitude higher than the doping of the drift layer. The main purpose of the JFET layer 23 is to reduce the resistivity in the near surface region of the MOSFET between the channels.

For purposes of the present invention, implantation of the JFET region is preferred. Implantation disrupts the SiC lattice structure near the upper surface, helping to achieve a negative mobility coefficient of the inversion layer.

Having a structure as described above, which has a negative mobility coefficient such that the SiC MOSFET exhibits a ZTCP, the SOA can be increased in a number of ways. Techniques used to create different threshold voltages can be used, as taught in Klodzinski. Further techniques suited for SiC processes are next described.

Figure 6:
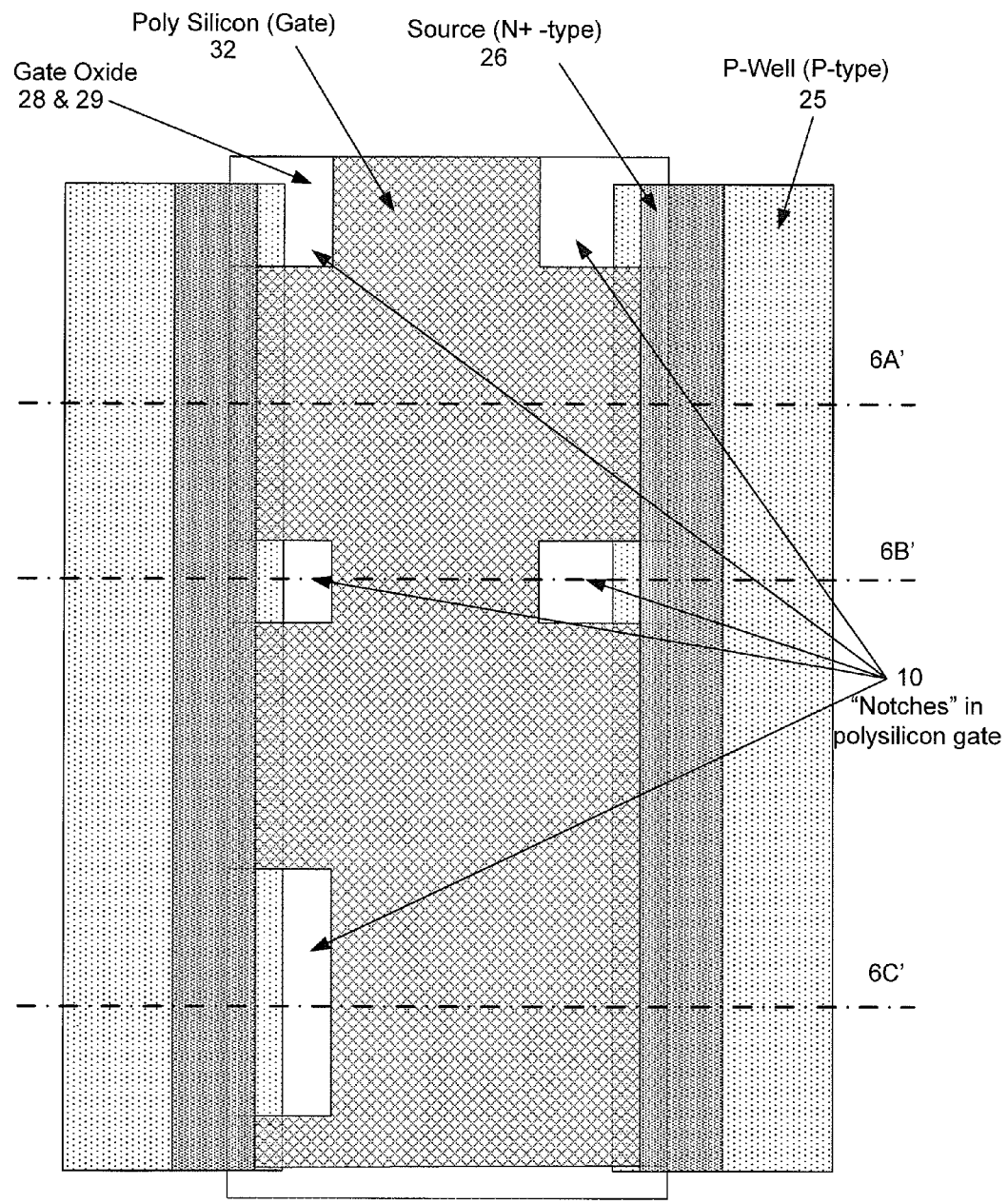
FIG. 6 is a top plan view and FIGS. 6A, 6B and 6C are cross-sectional views of a vertical SiC Power MOSFET illustrating the concept of polysilicon ("Poly") notches aimed to mute out channels at predetermined locations according to another embodiment of the invention.
Figure 6A:
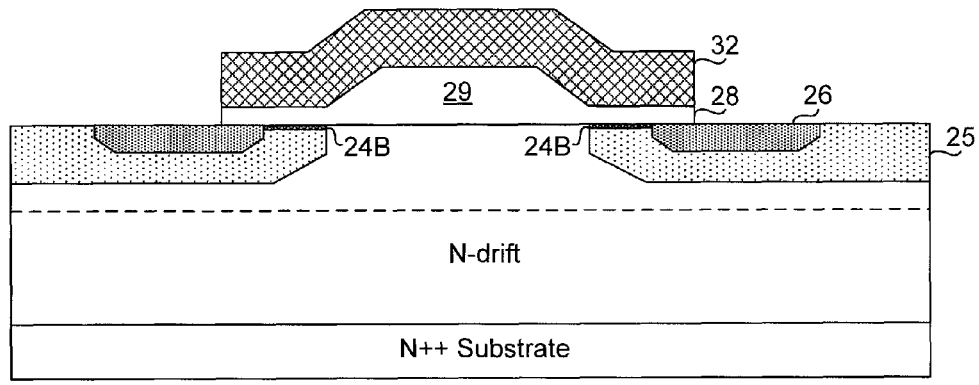

In one embodiment shown in FIGS. 4 and 6, the gate poly layer 32 is patterned such that predetermined areas of predetermined elements of the structure are not covered with gate polysilicon, and in this way the channels at those locations are "muted" (no conduction is taking place at those sites).

Figure 5A:
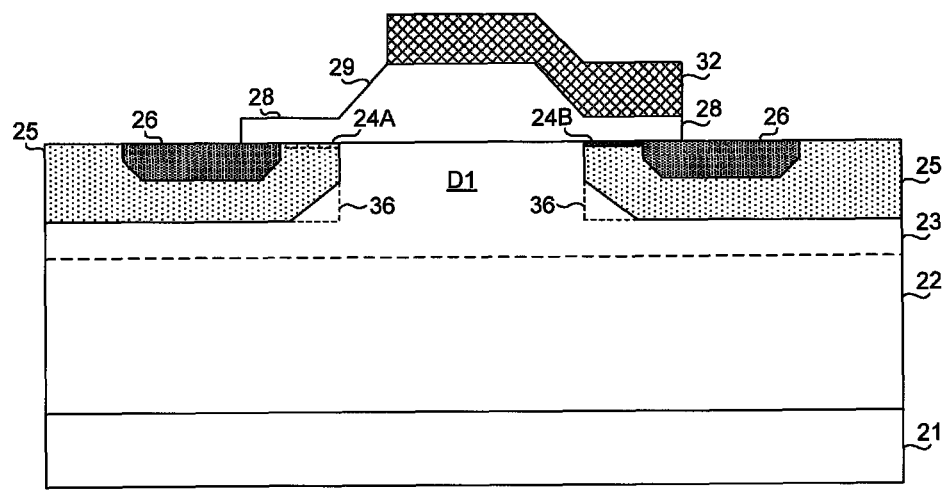
FIG. 5A is a cross-sectional view of a vertical (VDMOS) SiC Power MOSFET with Terraced oxide and "notched" poly gate, according to one embodiment of the invention.
Figure 5B:
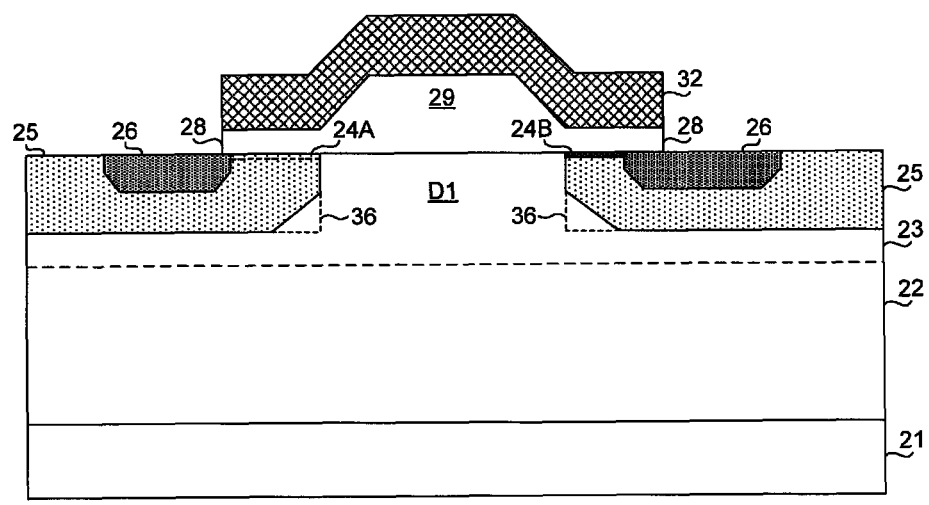
FIG. 5B is a cross-sectional view of a vertical SiC Power MOSFET with Terraced oxide and "muted" channels by offsetting the source implant at specific locations, according to another embodiment of the invention.
Figure 6B:
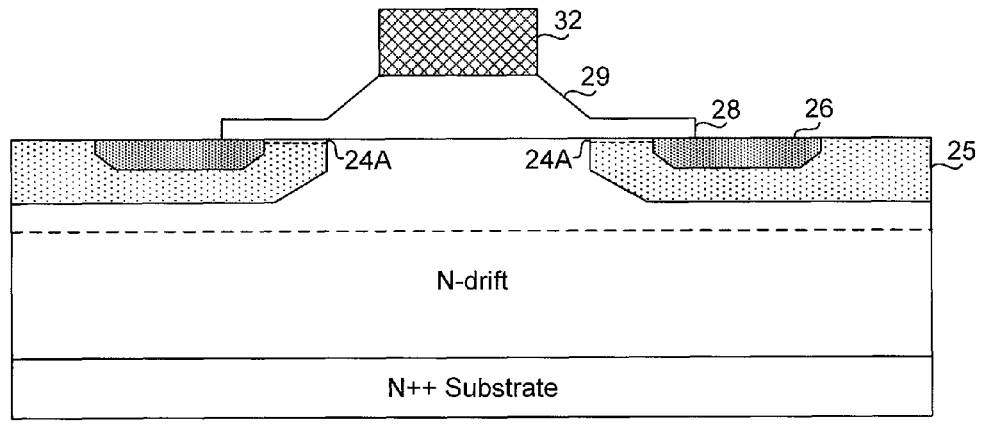
Figure 6C:
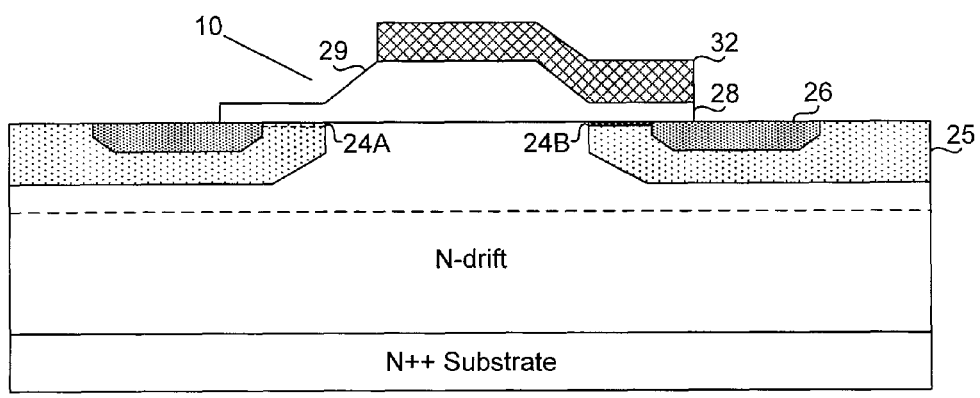

FIG. 6 and the cross sections 6A, 6B and 6C illustrate in a generic way design options, all of them described herein, and how to implement such a concept. FIG. 6 shows a mask layout or pattern for making notches 10 in the gate polysilicon to leave portions of channel region under the gate oxide uncovered, as shown in FIGS. 5A, 6B and 6C. This has the effect of "muting" the underlying portion of channel, denoted as channel 24A. Other portions of the gate polysilicon are not notched, as shown in FIG. 6A. The proportions of notched to un-notched gate regions can be varied to modify the SOA of the device.

Figure 7:
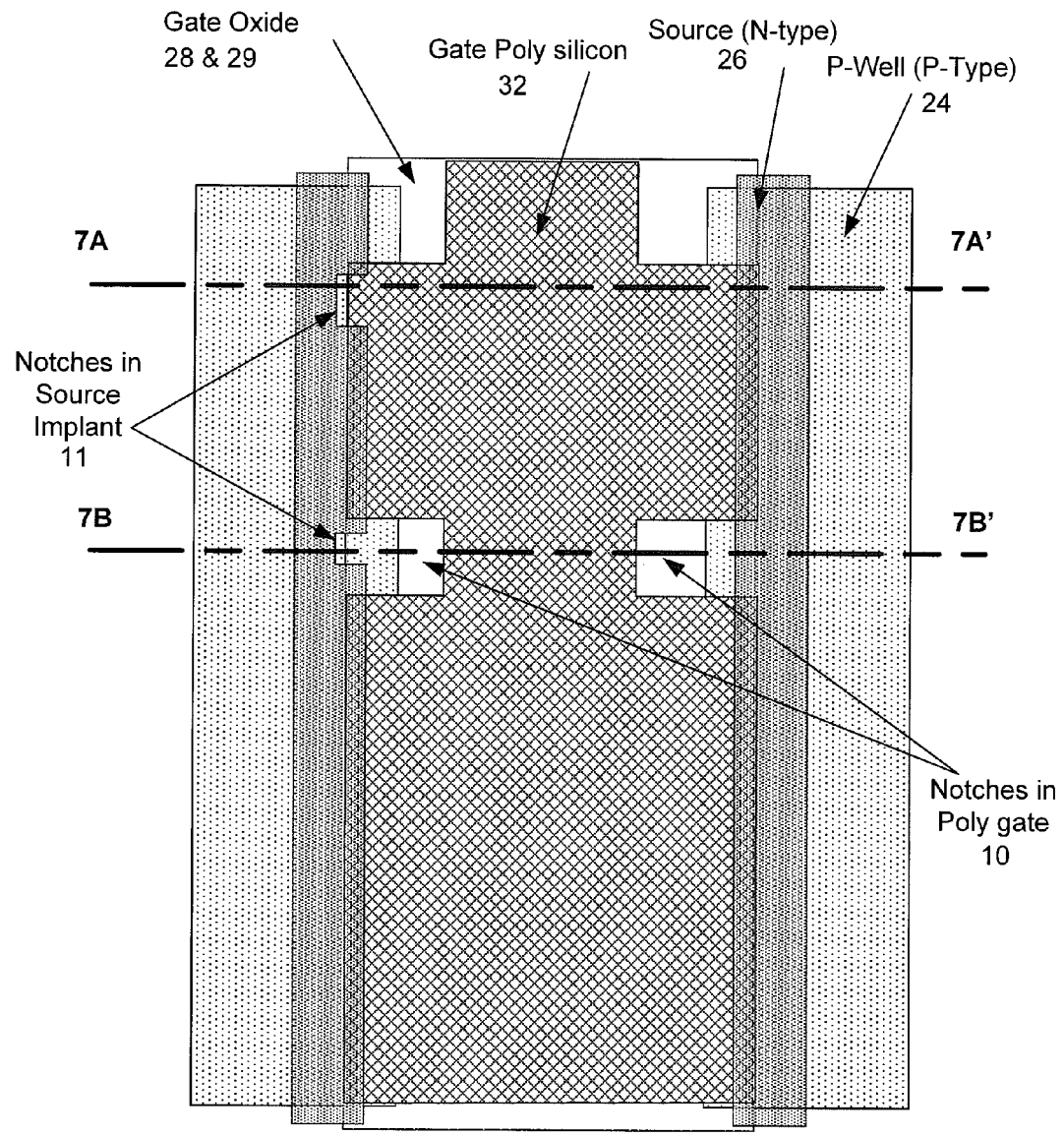
FIG. 7 is a top plan view and FIGS. 7A and 7B are cross-sectional views of a vertical SiC Power MOSFET according to another embodiment of the invention, showing a combination of "notched" poly and "notched" source implants, aimed to "mute" out channels at predetermined locations on the layout.
Figure 7A:
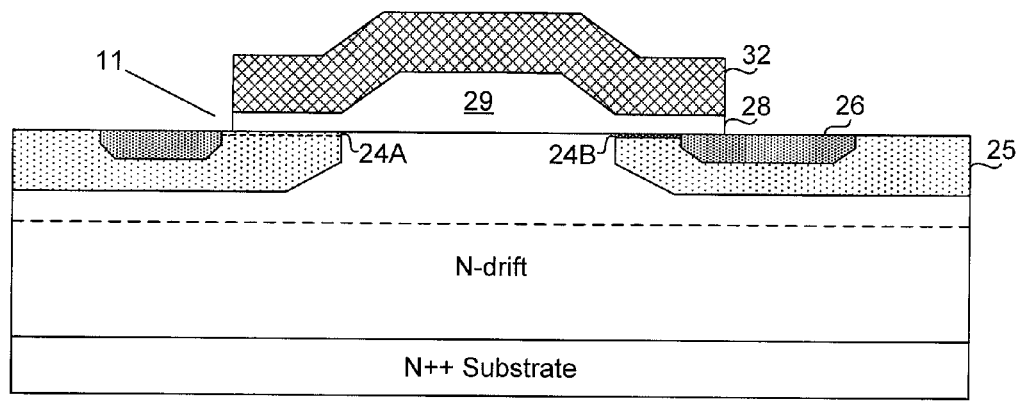
Figure 7B:
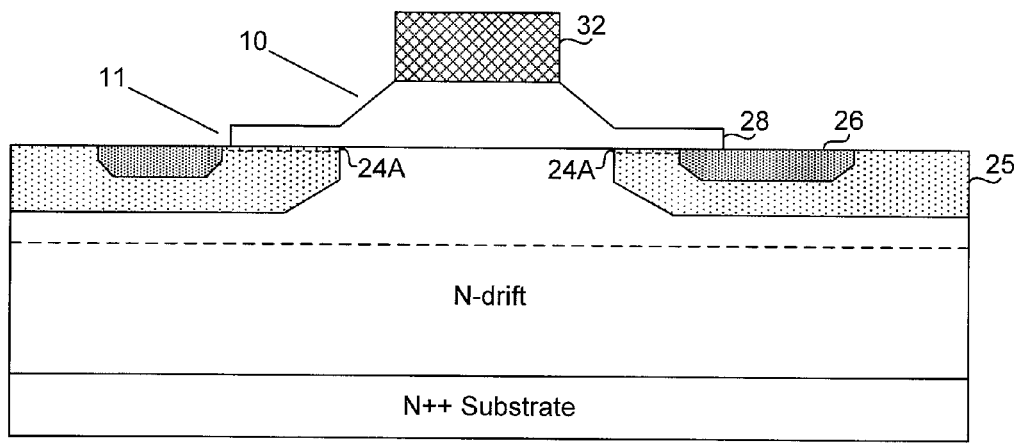

In a second embodiment, shown in FIG. 7, accompanied by cross sections in FIG. 7A, the source implant (N-type) is "notched" to lengthen or virtually eliminate the channel 24A at predetermined locations on the die. This can be combined with notching the poly as shown in FIG. 7B.

Figure 22:
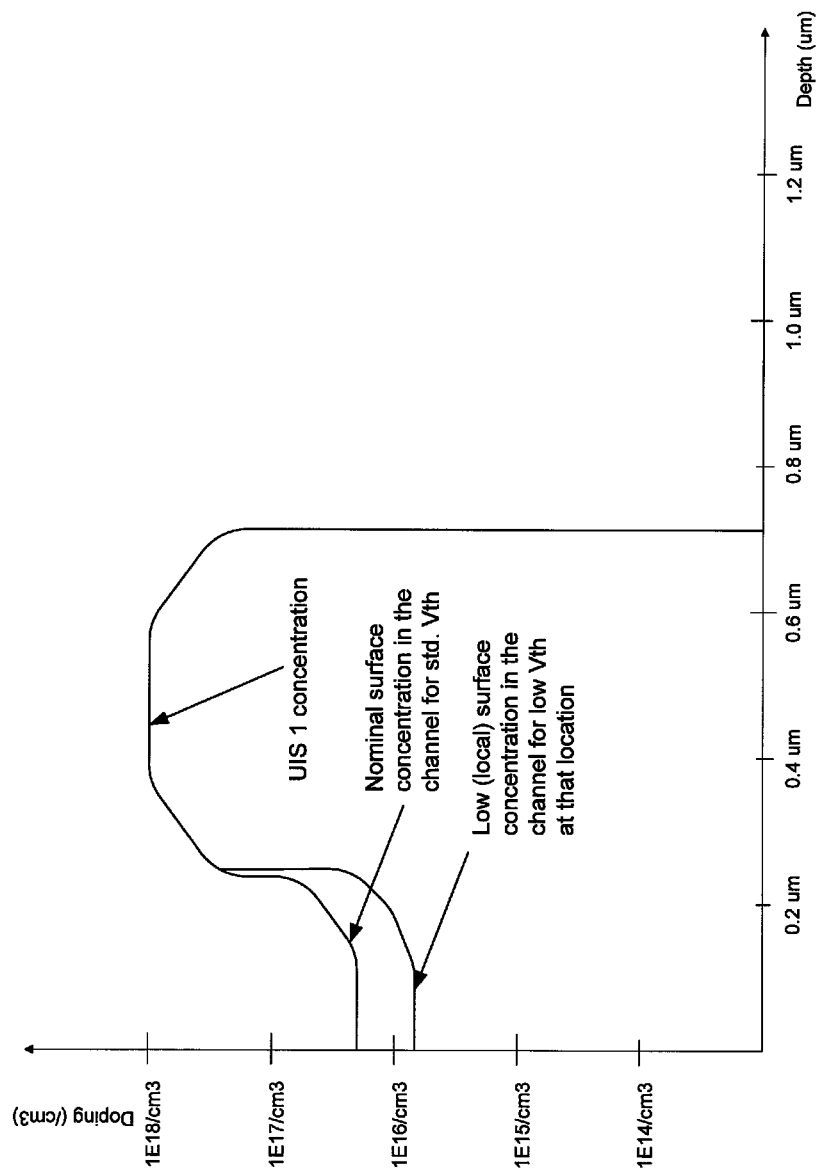
FIG. 22 is a graph of a preferred P-Well vertical doping profile according to an embodiment of the invention.

One elegant way to control the temperature dependence of the drain current on the gate bias is to create multiple small MOSFET areas with lower threshold voltage. This is achieved for vertical SiC Power MOSFETs by "tailoring" the Body implant (retrograde implants) such that the surface doping in the channel (see FIG. 17) is lower than the nominal doping of the rest of the die. By employing a retrograde doping in the channel and the UIS 1 implant technique described in the "Low Loss SiC MOSFET" patent application incorporated by reference herein, and shown in FIG. 22, the short channel effect at the low Vth sites is completely eliminated.

Figure 8:
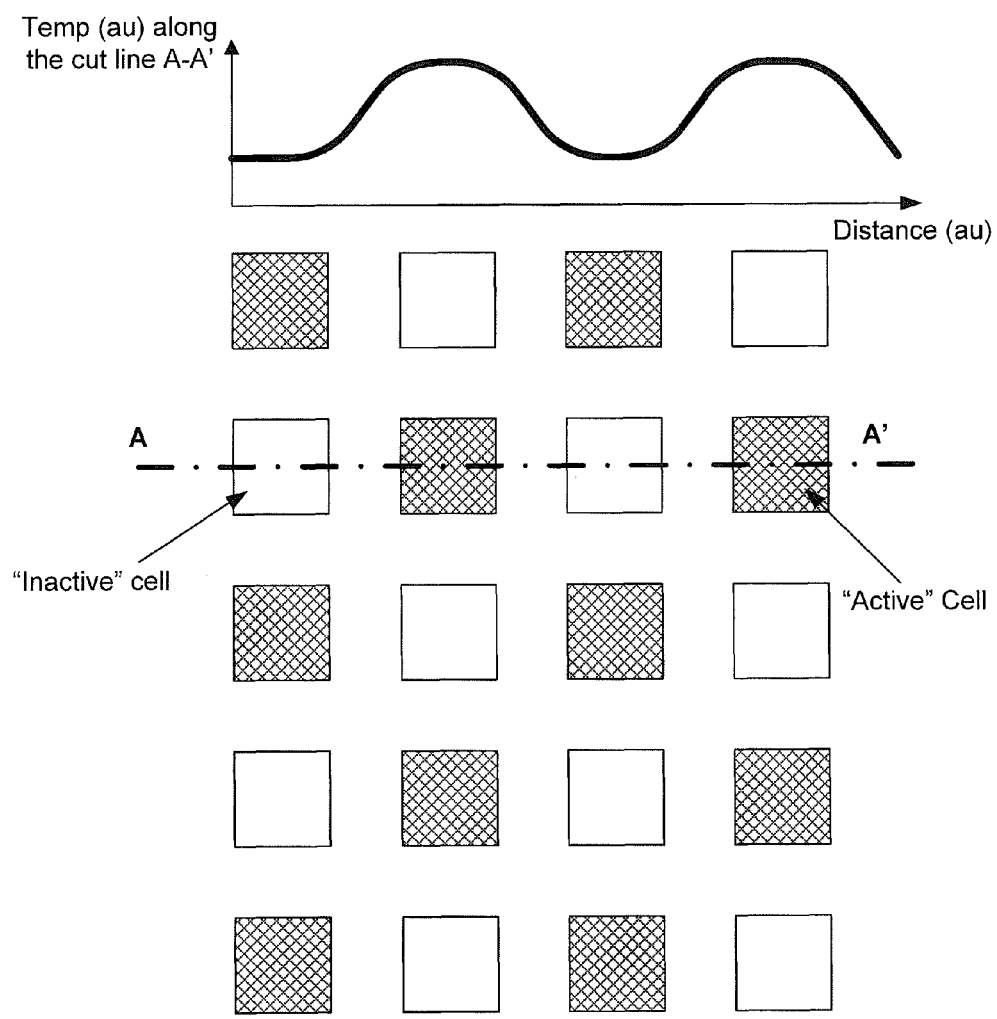
FIG. 8 is a top plan view of a vertical SiC Power MOSFET with cellular design and symmetrical arrangement of active and inactive cells, according to another embodiment of the invention, using either one of the muting methods proposed herein, for uniform temperature distribution across the die.
Figure 9:
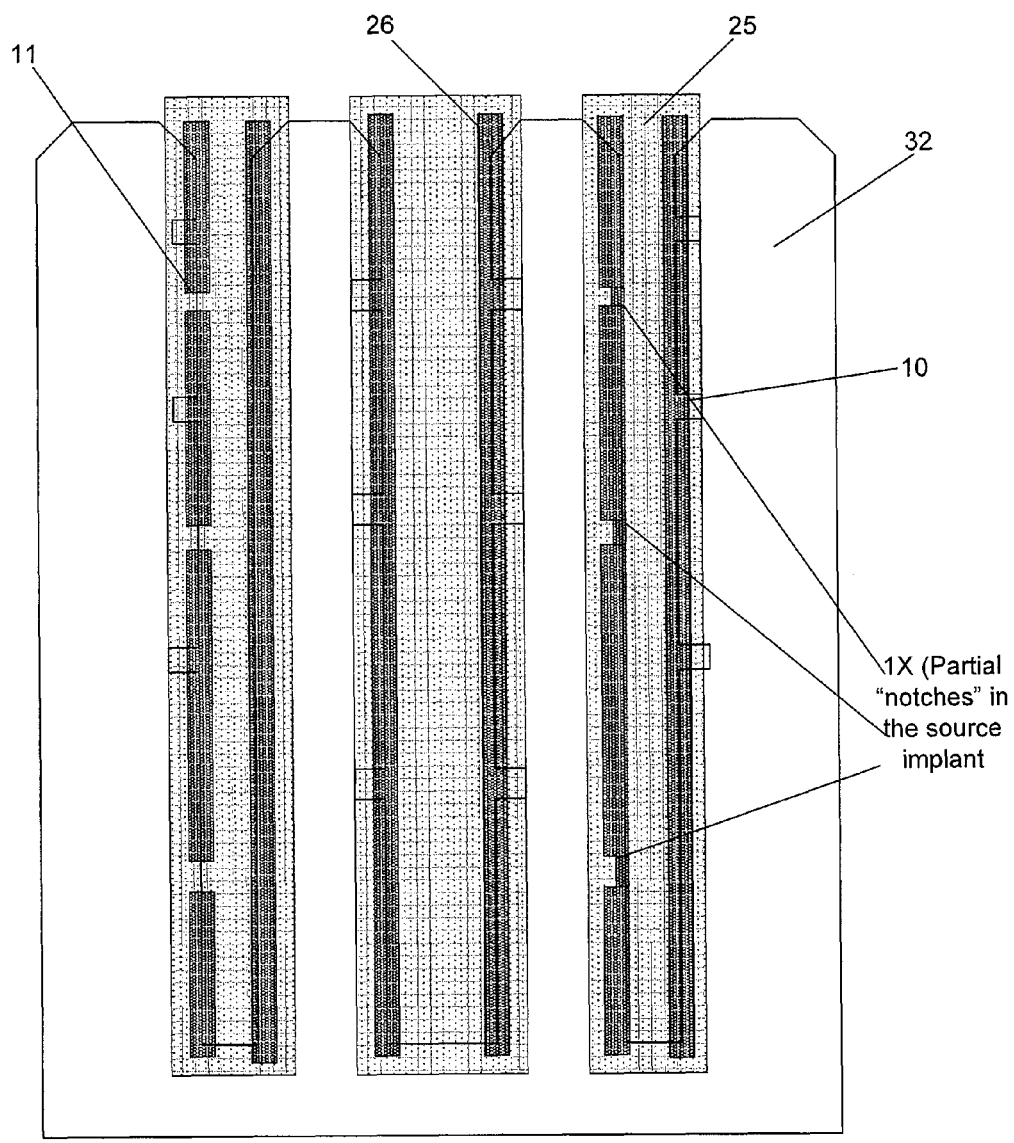
FIG. 9 is a top plan view of a vertical SiC Power MOSFET with comb-like or stripe design and alternate active and inactive channels ("muted" cells), according to another embodiment of the invention, using one of the methods described herein.
Figure 10:
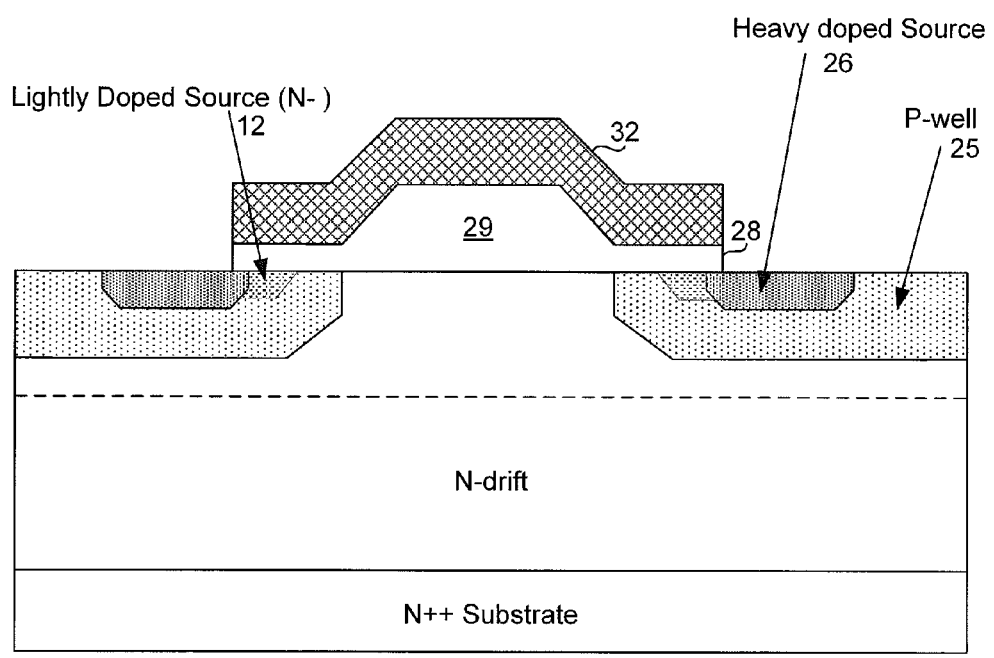
FIG. 10 is a cross-sectional view of a vertical SiC Power MOSFET with terraced oxide and "ballast" source resistors formed using a lighter N-type doping toward the channel, according to another embodiment of the invention.

Another important aspect of this invention, as shown in FIGS. 8 and 9, is the placement of the "active" and "inactive" cells on the layout in such way that the overall temperature distribution of the die is decreased. In FIGS. 8 and 9, this objective is achieved by surrounding the "active" cells with "inactive" ones. FIG. 8 shows a matrix of square cells; they could alternatively be hexagonal. FIG. 9 shows stripe cells, which can be interdigitated. The temperature variation across the die shown in FIG. 8 (also applicable to FIG. 9) is shown in arbitrary units (au) above each layout. The inactive cells in FIG. 8 are muted by any of the techniques described herein. Any other combination of active/inactive cells can be used. For example, decreasing the density of "active" cells in the center of the die, where the die temperature is always at its maximum) is one possibility of creating a more uniform temperature distribution across the die. Also, placement of the "active" and "inactive" cells (notched portions in FIG. 9) in relationship to the aspect ratio between the length of each side of the chip, can and should be taken in consideration when a SiC MOSFET is designed for linear operation (design for wide SOA). FIG. 9 also shows partial notches in the source implant, which can be used to produce the source offset and long channel 24A of FIG. 5B.

In another implementation, in-situ "ballasting" of the source resistance can be achieved either by reducing the doping of the source layer toward the channel (FIG. 10) or by placing a thin layer of barrier metal of predefined resistance in each cell (FIG. 11).

Figure 19:
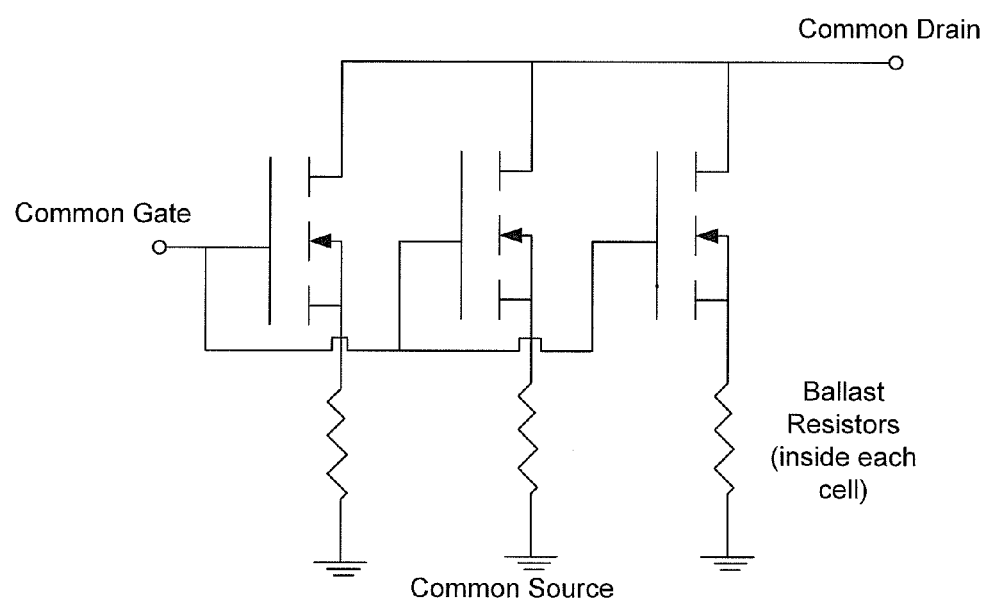
FIG. 19 is a schematic illustration modeling the distributed ballast resistor in each cell for the embodiments of FIGS. 10 and 11.

By using this ballasting resistance, any undesirable increase of the drain current will provide the negative feedback on the gate bias, as illustrated in FIG. 19. For example, a recommended dose of the $1^{st}$ source implant dose is Nitrogen at $1E13/cm^2$ to $1E14/cm^2$ while for the $2^{nd}$ Nitrogen implant, which will ensure low ohmic contact of the source, a suggested dose might be in the range of $1E15$-$5E15/cm^2$.

One important aspect of the invention, which specifically addresses the processing of a SiC Power MOSFET is the requirement to have a negative temperature coefficient of the mobility in the channel.

For a vertical SiC Power MOSFET, the partition between channel, JFET and drift resistances is such that the channel resistance is a large part of the total series ON resistance of the device. If the mobility has a positive temperature dependence (higher mobility at increased temperatures) then, when the device is operated in the linear mode (in the saturation part of the output characteristics), there will be no crossover point (Zero Temperature Crossover Point) on the transfer characteristics of the MOSFET and therefore the SOA of that type of part will be reduced (see FIG. 4).

The goal, then, is to design a SiC MOSFET with increased SOA such that the channel mobility will have a negative temperature coefficient. A simple expression of the dependence of the channel mobility on the temperature is assumed to be: $\mu_{channel}(T)=\mu_o(T/300)^\alpha$, where $\mu_o$ is a constant, the $\alpha$ is the coefficient of temperature dependence of the mobility, while T is the temperature in Kelvin degrees. It is preferred that $\alpha$ should be a negative number for the range of temperatures of interest (200-500 K) and, with $\alpha$ between $-2$ to $-5$. Some means to control the temperature coefficient of the mobility in the channel are:

Interface annealing conditions: It is well known that, as an example, NO (Nitrogen-Oxygen) annealling, post gate oxide formation can produce mobility which decreases with increasing temperature.

Choosing the proper SiC polytype: 15R polytype which has increased phonon scattering over conventional 4H is a good candidate. 3C polytype may also be a candidate as it has been shown to have high channel mobility and, therefore, have the capability of being a process with, for example, high surface roughness in the channel which is expected to provide the negative temperature coefficient required.

Choosing the proper "plane of face" for the channel region which is subject to inversion when the gate voltage is applied. The carbon face (C-face) of the SiC crystal holds promise to produce a gate region with high mobility at room temperature. With sufficient balancing of annealing to reduce interface surface states, it is likely a negative temperature coefficient may be produced.

By leaving or creating intentional "scattering" sites in the inversion region including selected higher doping regions in the inversion layer will move the temperature coefficient of mobility in the negative direction. Scattering sites can be created by implantation of non-doping species such as Argon which can disorder the crystal lattice.

Having described and illustrated the principles of the invention in a preferred embodiment thereof, it should be apparent that the invention can be modified in arrangement and detail without departing from such principles. We claim all modifications and variation coming within the spirit and scope of the following claims.

The invention claimed is:

1. A silicon carbide (SiC) vertical power MOSFET structure, comprising:
   a SiC substrate including an upper layer of a first dopant type defining a drift region extending from an upper surface of the substrate depthwise into the substrate;
   first and second body regions in the upper layer and adjoining the upper surface of the substrate and spaced apart about the drift region, the body regions being of a second dopant type opposite the first dopant type and having opposed lateral peripheries each forming a first PN junction with the drift region;
   first and second source regions positioned respectively in the first and second body regions across the upper surface of the substrate to define first and second source contact regions and located with respect to the opposed lateral peripheries of the body region to form a second PN junction spaced laterally from the first PN junction and to define first and second channel regions along the upper surface between the first and second PN junctions;
   a gate oxide layer on the upper surface extending over each of the channel regions;
   a gate conductor contacting the gate oxide; and
   a source conductor contacting the source regions and the body region therebetween;
   a portion of the first channel region being muted with respect to the second channel region so that the second channel region becomes conductive before the muted portion of the first channel region becomes conductive.

2. A silicon carbide (SiC) vertical power MOSFET structure according to claim 1, having transconductance characteristics Id-Vgs for various temperatures which have one or more crossover points in the drain current range specified by the maximum current rating of the part.

3. A silicon carbide (SiC) vertical power MOSFET structure according to claim 1 in which mobility of an inversion layer forming the channel regions has a negative temperature coefficient.

4. A silicon carbide (SiC) vertical power MOSFET structure according to claim 1 in which a portion of the first source region is offset at a first distance from the lateral periphery of first body region greater than a second distance of the second source region from the lateral periphery of the second body region so that a portion of the first channel region has a longer channel than the second channel region.

5. A silicon carbide (SiC) vertical power MOSFET structure according to claim 1 in which a portion of the first channel region is implanted with a higher doping concentration than the doping concentration of the second channel region.

6. A silicon carbide (SiC) vertical power MOSFET structure according to claim 5 in which the second body region is implanted with a retrograde doping profile.

7. A silicon carbide (SiC) vertical power MOSFET structure according to claim 1 in which a portion of the gate conductor overlying a portion of the first channel region is notched so that said portion of the first channel region is muted relative to the second channel region.

8. A silicon carbide (SiC) vertical power MOSFET structure according to claim 7 in which a portion of the first source region is notched.

9. A silicon carbide (SiC) vertical power MOSFET structure according to claim 1 in which a portion of the first source region is notched.

10. A silicon carbide (SiC) vertical power MOSFET structure according to claim 1 in which the source includes an in-situ ballast resistor.

11. A silicon carbide (SiC) vertical power MOSFET structure according to claim 10 in which a portion of the source region adjoining the second PN junction has a lower doping concentration than the remainder of the source region.

12. A silicon carbide (SiC) vertical power MOSFET structure according to claim 10 in which the source is coupled to a source conductor through a resistive barrier metal layer.

13. The SiC power MOSFET structure of claim 1, in which the gate oxide layer has a first thickness, the structure further including a terraced dielectric layer on the upper surface extending laterally from the gate oxide layer over the drift region, the terraced dielectric layer having a second thickness greater than the first thickness of the gate oxide layer.

14. The SiC power MOSFET structure of claim 1, including a JFET region of the first dopant type in an upper portion of the upper layer, enhancing a doping concentration of the drift region around the body region.

15. The SiC power MOSFET structure of claim 1, including a JFET implant region of the first dopant type in an upper portion of the upper layer, forming a disrupted lattice structure in the channel regions to provide the negative mobility characteristic.

16. The SiC power MOSFET structure of claim 1, including a UIS region of the second dopant type in the upper layer spaced laterally inward from the channel regions beneath the source regions, enhancing a doping concentration of the body region beneath the source regions.

17. The SiC power MOSFET structure of claim 1, including a pair of counterdoped regions extending along the opposite lateral peripheries of the body regions, the counterdoped regions spaced below the channel regions and away from the source regions and having a doping concentration less than a doping concentration of the body region at the upper surface.

18. The SiC power MOSFET structure of claim 1 in which the first and second channel regions each have a threshold voltage, the threshold voltage of the portion of the first channel being greater than the threshold voltage of the second channel region.

19. The SiC power MOSFET structure of claim 1 in which the gate oxide layer over the portion of the first channel region is thicker than the gate oxide layer over the second channel region.

* * * * *